US012596137B2

(12) United States Patent
Jun et al.

(10) Patent No.: US 12,596,137 B2
(45) Date of Patent: Apr. 7, 2026

(54) POGO PIN WITH ADJUSTABLE ELASTIC FORCE

(71) Applicant: OKINS ELECTRONICS CO., LTD, Uiwang-si (KR)

(72) Inventors: Jin Kook Jun, Gunpo-si (KR); Sang Hoon Cha, Hwaseong-si (KR)

(73) Assignee: OKINS ELECTRONICS CO., LTD., Uiwang-si (KR)

( * ) Notice: Subject to any disclaimer, the term of this patent is extended or adjusted under 35 U.S.C. 154(b) by 129 days.

(21) Appl. No.: 18/435,029

(22) Filed: Feb. 7, 2024

(65) Prior Publication Data

US 2024/0264201 A1 Aug. 8, 2024

(30) Foreign Application Priority Data

Feb. 7, 2023 (KR) ......................... 10-2023-0015928

(51) Int. Cl.
*G01R 1/067* (2006.01)
(52) U.S. Cl.
CPC ................................ *G01R 1/06722* (2013.01)
(58) Field of Classification Search
None
See application file for complete search history.

(56) References Cited

U.S. PATENT DOCUMENTS

| | | | | | |
|---|---|---|---|---|---|
| 5,003,255 | A | * | 3/1991 | Kazama | G01R 1/06722 |
| | | | | | 324/754.14 |
| 6,341,962 | B1 | * | 1/2002 | Sinclair | H01R 12/714 |
| | | | | | 439/71 |

| | | | | | |
|---|---|---|---|---|---|
| 6,677,772 | B1 | * | 1/2004 | Faull | G01R 1/06722 |
| | | | | | 324/755.05 |
| 7,626,408 | B1 | * | 12/2009 | Kaashoek | G01R 1/06722 |
| | | | | | 324/755.05 |
| 7,969,170 | B2 | * | 6/2011 | Kazama | G01R 1/06772 |
| | | | | | 324/754.01 |
| 8,610,447 | B2 | * | 12/2013 | Lee | G01R 1/06722 |
| | | | | | 324/756.02 |

(Continued)

FOREIGN PATENT DOCUMENTS

| | | |
|---|---|---|
| JP | 2000340326 | 12/2000 |
| JP | 2008098277 | 4/2008 |

(Continued)

OTHER PUBLICATIONS

Office Action issued in Japanese Application No. 2024-017333 dated Feb. 4, 2025 (Japanese Only).

(Continued)

*Primary Examiner* — Richard Isla
(74) *Attorney, Agent, or Firm* — NORTON ROSE FULBRIGHT US LLP

(57) ABSTRACT

A pogo pin whose elastic force can be adjusted according to a contacting direction is disclosed. According to an aspect of the present invention, provided is a pogo pin with adjustable elastic force, including: a housing; plunger pins mounted on ends of the housing to directly contact a measurement object; and a spring installed inside the housing to provide elastic force so that the plunger pin contacts the measurement object, wherein a local fixing part protruding inward is formed on one side of the housing so that a first position of the spring can be pressed and fixed.

10 Claims, 7 Drawing Sheets

(56)  References Cited

U.S. PATENT DOCUMENTS

| | | | | |
|---|---|---|---|---|
| 9,651,577 B2 * | 5/2017 | Joo | .................... | G01R 1/07378 |
| 9,983,230 B2 * | 5/2018 | Choi | .................. | G01R 1/06722 |
| 2007/0018666 A1 * | 1/2007 | Barabi | .............. | G01R 1/06722 |
| | | | | 324/755.05 |
| 2021/0048451 A1 * | 2/2021 | Yang | .................. | G01R 1/06722 |

FOREIGN PATENT DOCUMENTS

| | | | | | | |
|---|---|---|---|---|---|---|
| JP | 2008098277 | A | * | 4/2008 | .............. | H05K 3/00 |
| JP | 2014211378 | | | 11/2014 | | |
| JP | 2014211378 | A | * | 11/2014 | .............. | G01R 1/06 |
| KR | 10-1330999 | | | 11/2013 | | |
| KR | 20-2014-0005775 | | | 11/2014 | | |
| KR | 10-2016-0035225 | | | 3/2016 | | |
| KR | 10-2033135 | | | 10/2019 | | |
| KR | 10-2021-0111774 | | | 9/2021 | | |

OTHER PUBLICATIONS

Office Action issued in Korean priority Application No. 10-2023-0015928, dated Feb. 28, 2023 (Korean Only).

* cited by examiner

POGO PIN WITH ADJUSTABLE ELASTIC FORCE

CROSS-REFERENCE TO RELATED APPLICATION

This application claims priority to and the benefit of Korean Patent Application No. 10-2023-0015928, filed on Feb. 7, 2023, the disclosure of which is incorporated herein by reference in its entirety.

FIELD OF THE DISCLOSURE

The present invention relates to a pogo pin, and more particularly, to a pogo pin whose elastic force can be adjusted according to a contacting direction.

BACKGROUND

In general, a pogo pin is a component that has a spring mounted therein and allows plunger pins or a plunger pin installed on both sides or one side to contact an object by the elastic force of the spring.

In general, spring probe pins, also known as Pogo Pins, are components widely used for inspection equipment such as semiconductor wafers, LCD modules, camera modules, image sensors, and semiconductor packages, as well as various sockets, battery connection parts of mobile phones, etc.

A conventional pogo pin is disclosed in Patent Registration No. 10-1330999. The conventional pogo pin consists of an upper connection portion, a lower connection portion, a spring that applies elastic force to the upper connection portion and the lower connection portion, and a cylindrical body that accommodates portions of the upper connection portion and the lower connection portion, and the spring. The upper connection portion and the lower connection portion of the conventional pogo pin are configured to be prevented from being removed from the cylindrical body by being caught by the cylindrical body in part, and to receive the elastic force by the spring installed between the upper connection portion and the lower connection portion. The conventional pogo pin is an inspection tool that requires miniaturization because the spring plays a cushioning role so that the object to be inspected is not damaged, and the spring must enter the barrel interior, such as a cylindrical body and housing.

Since the pogo pin according to conventional technology is a form in which the upper and lower portions of the spring are provided with the elastic force, the elastic force of the spring is uniformly transmitted to the upper and lower portions of the plunger pin, so the same elastic force is applied regardless of the case of the upper and lower portions of the contact object.

SUMMARY

The present invention is to solve the above problems, and is directed to providing a pogo pin with adjustable elastic force that can provide different elastic forces to the upper and lower connection parts depending on the upper and lower connection parts and the surrounding environment.

The problems of the present invention are not limited to those mentioned above, and other problems not mentioned will be clearly understood by those of ordinary skill in the art from the following description.

According to an aspect of the present invention, provided is a pogo pin with adjustable elastic force, including: a housing; plunger pins mounted on ends of the housing to directly contact a measurement object; and a spring installed inside the housing to provide elastic force so that the plunger pin contacts the measurement object, wherein a local fixing part protruding inward is formed on one side of the housing so that a first position of the spring can be pressed and fixed.

In this case, the plunger pins may be installed at an upper and lower parts of the housing, respectively.

In this case, the local fixing part may be formed in the form of at least one point at a first position of the housing.

In this case, when a plurality of local fixing parts are formed, the first position may be formed at the same height in a direction perpendicular to the longitudinal direction of the housing.

In this case, at least one local fixing part may be formed in the shape of a line with the first position being in a direction perpendicular or parallel to the longitudinal direction.

In this case, the local fixing part may be formed over the entire circumference of the housing, with the first position being in a direction perpendicular to the longitudinal direction.

In this case, the spring may have one or more invalid windings that do not provide elastic force and a local fixing part may be formed in one or more selected from the invalid windings.

In this case, by forming the local fixing part, the elastic force of the plunger pins with respect to measurement objects in close contact with an upper and lower parts may be set and adjusted.

In this case, a stepped jaw portion may be formed in the housing of the pogo pin, and the stepped jaw portion may be fixed to a pin fixing member for fixing the pogo pin.

In this case, the pogo pin may further include a pin fixing member for fixing the housing of the pogo pin, and the pin fixing member may be formed with a stepped jaw portion that engages upper and lower ends of the housing.

In this case, plunger pins may be installed at upper and lower parts of the pogo pin, respectively, and one pin of the upper and lower pins may be installed in a state that is always pressed against a measurement object.

According to the above configuration, the pogo pin with adjustable elastic force according to an embodiment of the present invention can form a local fixing part in the housing so that the spring is fixed based on that part, so that the elastic force provided to the upper and lower parts can be adjusted as desired.

In addition, in the actual field, there is a problem in that the force is small when the stroke is input only on the opposite side in a state in which the stroke is insufficient, where the force is not input on one side of the pogo pin, but the present invention can be set to have a force suitable for a desired stroke separately from the stroke on the opposite side. In other words, when the stroke of the lower portion is applied differently from the normal, there is a problem in the lower portion contact, and even if the normal stroke is applied from the upper portion, the force connected to the lower portion is applied, causing a problem to occur even at the upper portion, but on the contrary, even if the stroke applied from the upper portion is different, the force applied to the board disposed at the lower portion may be set to vary.

DETAILED DESCRIPTION OF THE INVENTION

Figure 1:
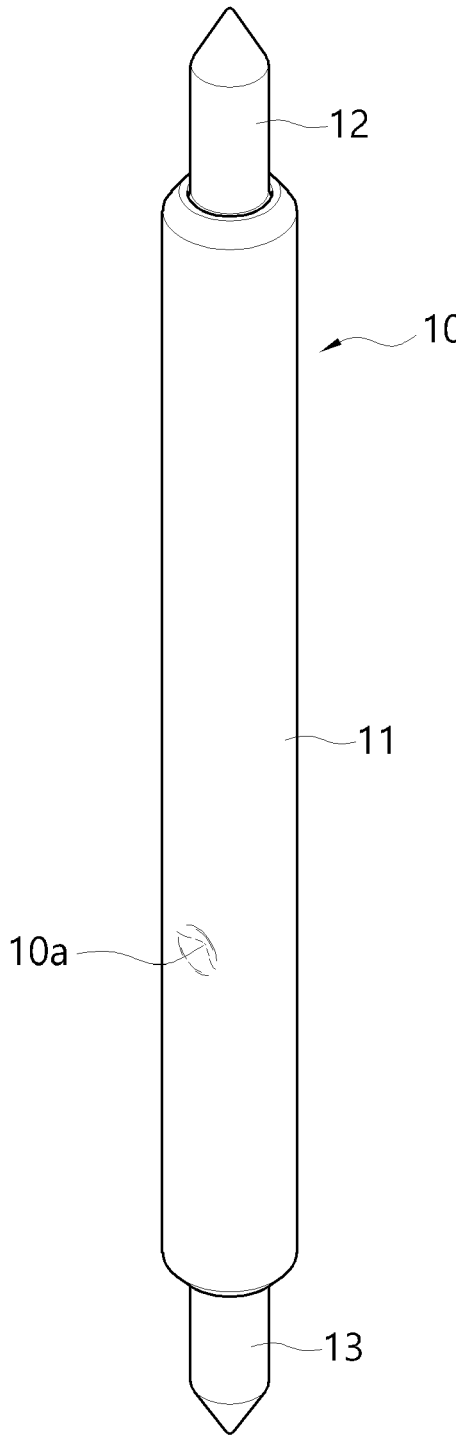
FIG. 1 is a perspective view of a pogo pin with adjustable elastic force according to a first embodiment of the present invention.

Hereinafter, exemplary embodiments of the present invention will be described in detail so that those of ordinary skill in the art can readily implement the present invention with reference to the accompanying drawings. The present invention may be embodied in many different forms and is not limited to the embodiments set forth herein. In the drawings, parts unrelated to the description are omitted for clarity of description of the present invention, and throughout the specification, same or similar reference numerals denote same elements.

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the embodiments described in the present specification and the configurations shown in the drawings correspond to preferred embodiments of the present invention, and do not represent all the technical idea of the present invention, so the configurations may have various examples of equivalent and modification that can replace them at the time of filing the present invention.

It should be understood that the terms "comprise" or "have" or the like when used in this specification, are intended to describe the presence of stated features, integers, steps, operations, elements, components and/or a combination thereof but not preclude the possibility of the presence or addition of one or more other features, integers, steps, operations, elements, components, or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the pogo pin with adjustable elastic force according to the first embodiment of the present invention will be described with reference to the drawings.

Figure 2:
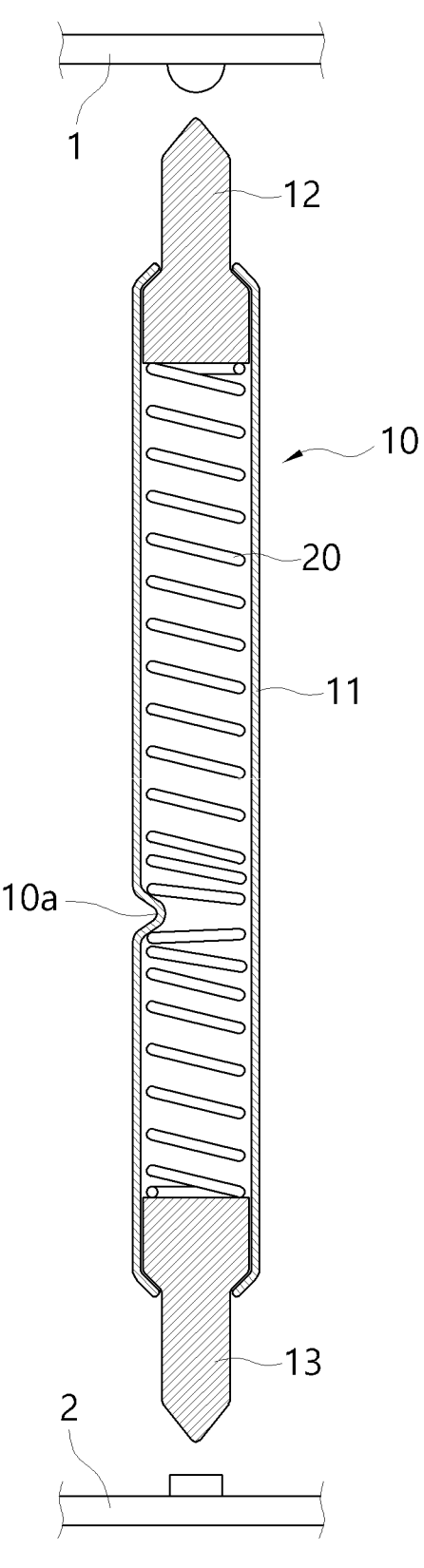
FIG. 2 is a longitudinal cross-sectional view of the pogo pin with adjustable elastic force according to the first embodiment of the present invention.

Referring to FIGS. 1 and 2, the pogo pin 10 according to an embodiment of the present invention includes a housing 11, plunger pins 12 and 13, and a spring 20.

The housing 11 has a cylindrical shape extending in the longitudinal direction and has a shape in which upper and lower portions are partially open, with reference to FIG. 1.

In this case, the housing 11 is generally made of a metal material that conducts electricity, and has a plastic nature that maintains its shape when bent or collapsed due to external stress. Therefore, as described later, when force is applied to form a local fixing part, its shape is maintained.

Referring to FIGS. 1 and 2, the plunger pins 12 and 13 may be mounted on the ends of the housing 11 to directly contact measurement objects 1 and 2.

In this case, a part of the plunger pins 12 and 13, which is a body part, is hidden inside the housing, and the remaining part, which is a pin part, is exposed to the outside. In the case of the body part, the end of the internal spring 20 has a shape, diameter, or thickness that can be supported by being caught, and the pin part has a sharp end and comes into contact with the measurement objects 1 and 2. Of course, the plunger pins 12 and 13 may also be made of an electrically conductive metal material.

Referring to FIG. 2, the spring 20 may be installed inside the housing 11 to provide elastic force so that the plunger pins 12 and 13 contact the measurement objects 1 and 2.

In this case, a local fixing part 10a protruding inward may be formed on one side of the housing 11 so that a first position of the spring 20 can be pressed and fixed.

In this case, the elastic force of the spring 20 may be provided differently up and down based on the first position where the local fixing part 10a is formed. That is, in the case where the local fixing part 10a is formed in the center at the middle height with respect to FIG. 2, the elastic force of the spring 20 can be provided equally at both the upper and lower parts, and in the case where the local fixing part 10a is formed with the first position below the middle height biased toward the lower side as shown in FIG. 1, a greater elastic force is applied at the upper part than at the lower part based on the first position, so that a greater elastic force is applied to the upper plunger pin 12 than to the lower plunger pin 13.

In this case, the plunger pins 12 and 13 are respectively installed on the upper and lower parts of the housing 20, and when installed on only one side, a local fixing part 10a may be formed.

In this case, the local fixing part 10a may be formed in the form of at least one point at the first position of the housing 11. Here, when a plurality of local fixing parts 10a are formed, the first position may be formed at the same height in a direction perpendicular to the longitudinal direction of the housing 11.

In this case, as another embodiment, at least one of the local fixing parts 10b, 10c, and 10d may be formed in a line shape with the first position in a direction perpendicular to or parallel to the longitudinal direction.

In this case, as another embodiment, the local fixing part 10c may be formed over the entire circumference of the housing, with the first position being in a direction perpendicular to the longitudinal direction.

In this case, as another embodiment, the spring 120 may have one or more invalid windings 120a, 120b, and 120c that do not provide elastic force, and a local fixing part may be formed in one or more selected from the invalid windings.

Referring to FIG. 1, a perspective view of a pogo pin 10 with adjustable elastic force according to a first embodiment of the present invention is shown, and referring to FIG. 2, a longitudinal cross-sectional view of the pogo pin 10 with adjustable elastic force according to the first embodiment of the present invention is shown. Based on the drawing in FIG. 1, a housing 11 is shown vertically in the center, and plunger pins 12 and 13 are protruding and coupled to the upper and lower parts of the housing 11, respectively. In this case, a local fixing part 10*a* is formed at a height of ⅓ of the housing 11. Referring to FIG. 2, plunger pins 12 and 13 are installed on the upper and lower parts of the housing 11 to receive the elastic force of the spring 20 in the outer direction of the housing 11. In this case, the local fixing part 10*a* has a recessed form when viewed from the outside and a protruding form when viewed from the inside. Therefore, by being protruded in between the spring 20 body at that position, the spring 20 is divided into the upper and lower portions based on the first position based on the height at that position, and because the spring 20 has a larger number of windings in the upper portion than in the lower portion, the elastic force provided to the upper plunger pin 12 is larger than the elastic force provided to the lower plunger pin 13 based on the first position. Of course, on the contrary, if the first position is formed above the middle height of the housing 11, the elastic force of the lower plunger pin 13 can be provided strongly. In this case, since the pogo pin 10 is usually used for semiconductor package inspection, etc., a semiconductor package 1 is disposed above the pogo pin, and a substrate 2 is disposed below the pogo pin. Typically, a large number of pogo pins 10 are mounted on a probe card of semiconductor inspection equipment and are placed between a substrate and a semiconductor package wafer to inspect the wafer.

Figure 3:
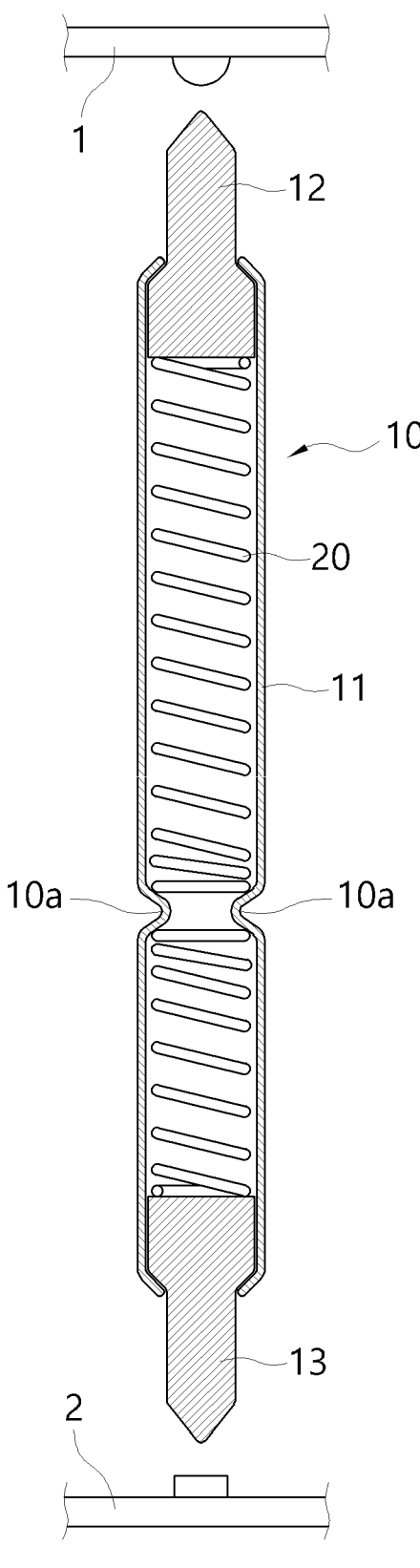
FIG. 3 is a perspective view of a pogo pin with adjustable elastic force according to a second embodiment of the present invention.

FIG. 3 is a longitudinal cross-sectional view of a pogo pin 10 with adjustable elastic force according to a second embodiment of the present invention. Here, two local fixing parts 10*a* are formed at the same height at the first position at an angle of 180 degrees. In addition to this, of course, multiple local fixing parts 10*a* may be formed. By forming a plurality of local fixing parts 10*a* in the form of points in this way, it is possible to reliably divide the elastic force of the spring 20 into the upper and lower parts at the first position.

Figure 4:
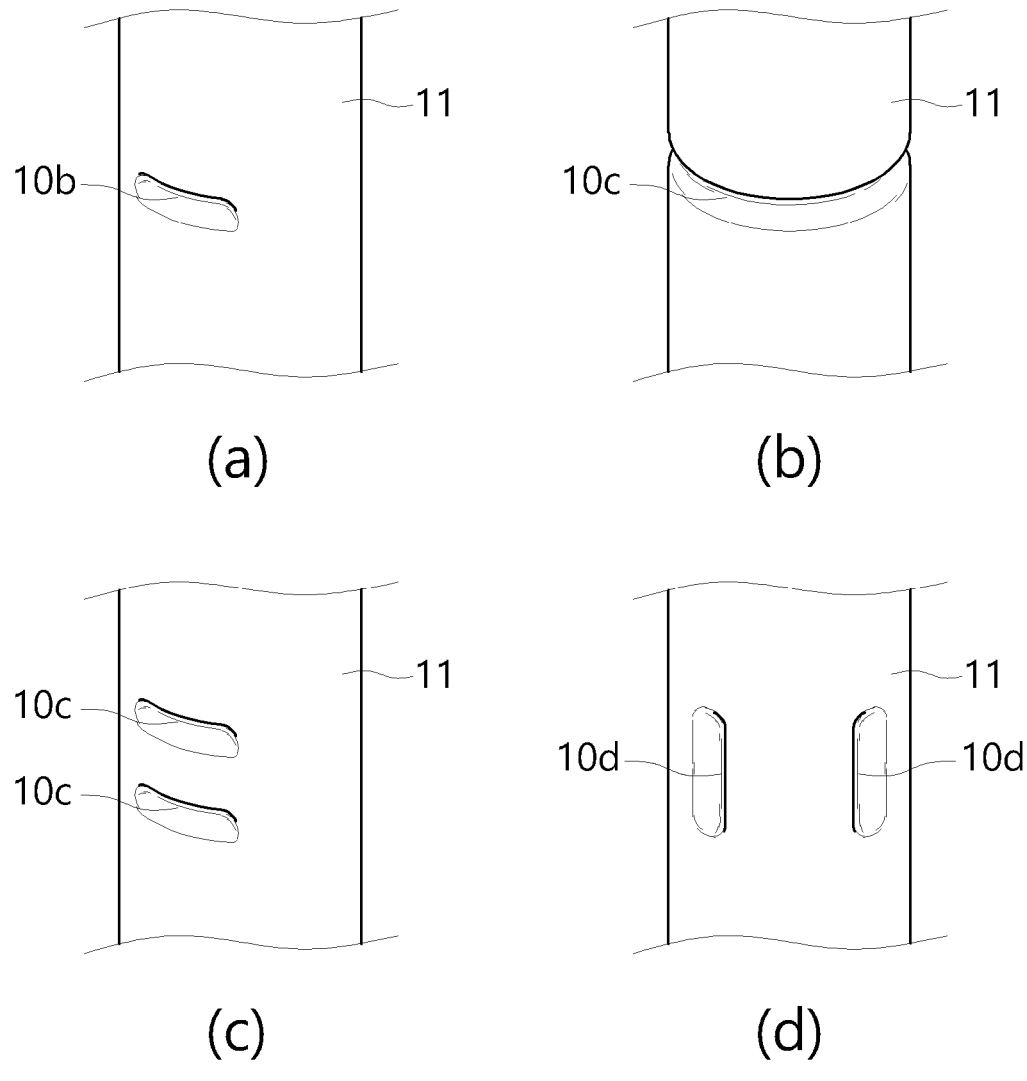
FIG. 4 is a perspective view of a portion of a pogo pin with adjustable elastic force according to other embodiments of the present invention.

Referring to FIG. 4, a perspective view of a portion of a pogo pin with adjustable elastic force according to other embodiments of the present invention is shown. In the case of (a), the local fixing part 10*b* takes a form of one recessed in a straight form, which is almost similar to the local fixing part 10*a* shown in FIGS. 1 and 2, but since it is formed in a straight form in the horizontal direction based on the drawing, it is very high in terms of local fixing reliability of the spring 20 than in the case of forming the local fixing part 10*a* with one point. In the case of (b), the local fixing part 10*c* is formed around the entire circumference of the housing 11 in a ring shape in a vertical direction with respect to the longitudinal direction of the housing 11, that is, in a horizontal direction with respect to the drawing. In this case, of course, the spring fixing reliability may be higher than in the case of (a). However, stress fatigue stability must be considered. In the case of (c), the local fixing part 10*c* is formed in two rows to increase reliability more than in the case of (a). In the case of (d), two or more local fixing parts 10*d* are formed in a straight line along the longitudinal direction. In this way, even when the local fixing part is formed along the vertical direction, that is, the longitudinal direction in the drawing, the elastic force provided to the upper and lower parts can be adjusted in the same way.

Figure 5:
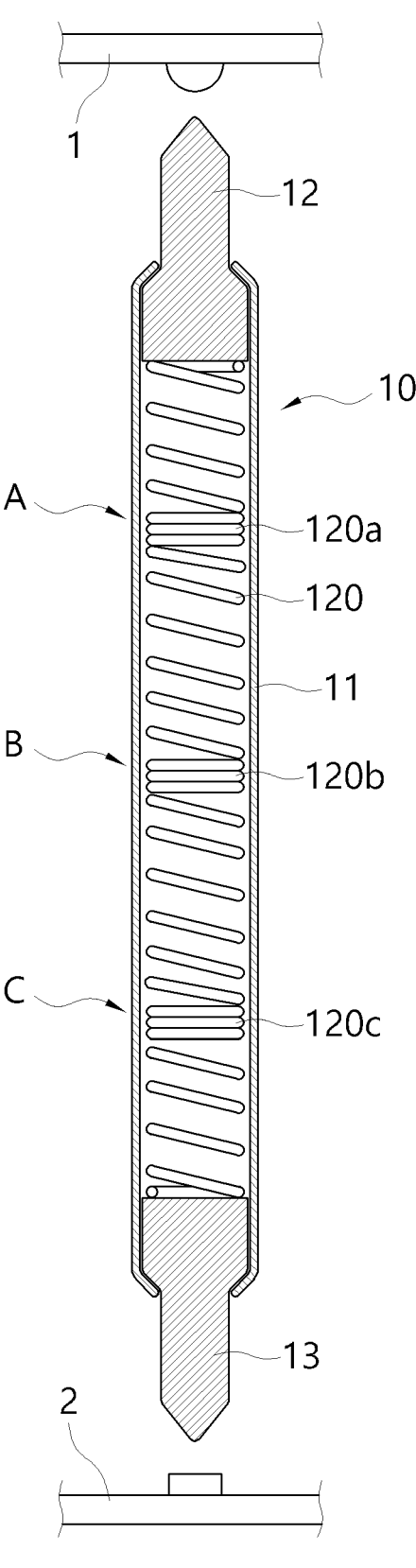
FIG. 5 is a longitudinal cross-sectional view of a pogo pin with adjustable elastic force according to a third embodiment of the present invention.

Meanwhile, referring to FIG. 5, a longitudinal cross-sectional view of a pogo pin 10 with adjustable elastic force according to a third embodiment of the present invention is shown. In the present invention, the housing 11 and the plunger pins 12 and 13 which are provided with elastic force by the spring 120 on the upper portion of the housing 11 may be included, and the spring 120 may have one or more so-called invalid windings 120*a*, 120*b*, 120*c* that do not provide elastic force, and a local fixing part may be formed in one or more selected from the invalid windings 120*a*, 120*b*, 120*c*. In this case, so-called invalid windings 120*a*, 120*b*, 120*c*, which are partially adhered to the body of the spring 120 and cannot provide elastic force, are formed at specific positions A, B, and C according to the height of the housing 11, whereby they are formed in the spring 120 in advance so that they can be divided into a plurality of parts, and based on this, a first position is assumed at the invalid winding position 120*a*, 120*b*, 120*c* desired by the worker or the user, and a local fixing part may be formed in that part. At this time, by assuming in advance the invalid winding 120*a*, 120*b*, 120*c* parts in response to the consumer's request and shipping the product, various types of local fixing parts can be formed in the invalid winding 120*a*, 120*b*, 120*c* parts desired by the consumer. If the local fixing part is formed in the invalid winding 120*a*, 120*b*, 120*c* parts, a decrease in elastic force or a change in elastic force that is different from prediction can be reduced compared to the case where it is formed in parts other than the invalid winding 120*a*, 120*b*, 120*c* parts of the spring 120.

Figure 6:
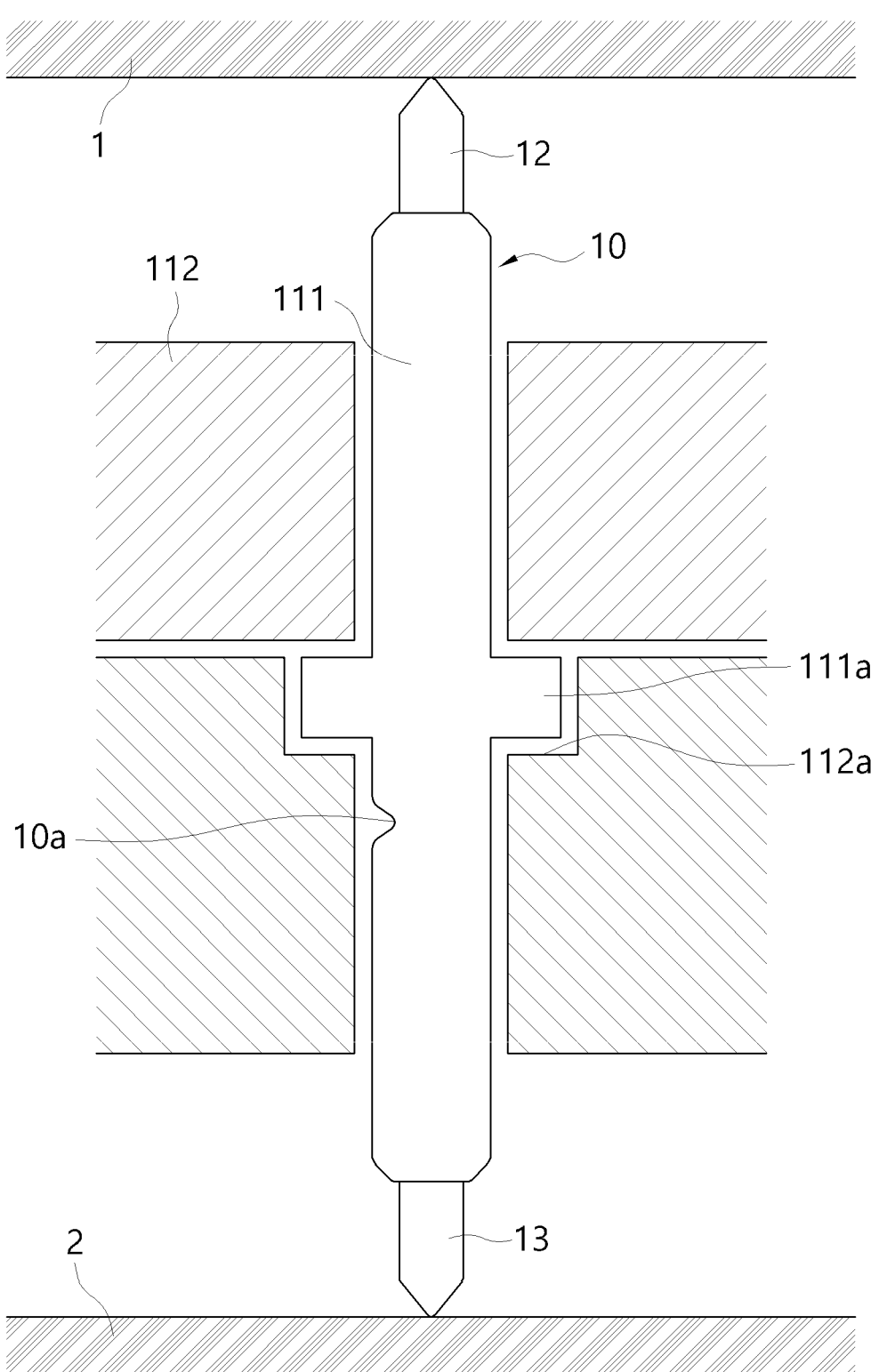
FIG. 6 is a partial cross-sectional view of a pogo pin with adjustable elastic force according to a fourth embodiment of the present invention.

Meanwhile, referring to FIG. 6, a partial cross-sectional view of a pogo pin 10 with adjustable elastic force according to a fourth embodiment of the present invention is shown. A stepped jaw portion 111*a* may be formed in the housing 111 of the pogo pin 10, and the stepped jaw portion 111*a* may be fixed to a stepped jaw portion 112*a* of a pin fixing member 112 for fixing the pogo pin 10. In this way, the housing 111 of the pogo pin 10 can be fixed to the pin fixing member 112, and even at this time, by forming the local fixing part 10*a*, the elastic force of the plunger pins 12 and 13 with respect to the measurement objects 1 and 2 in close contact with the upper and lower parts can be set and adjusted.

Figure 7:
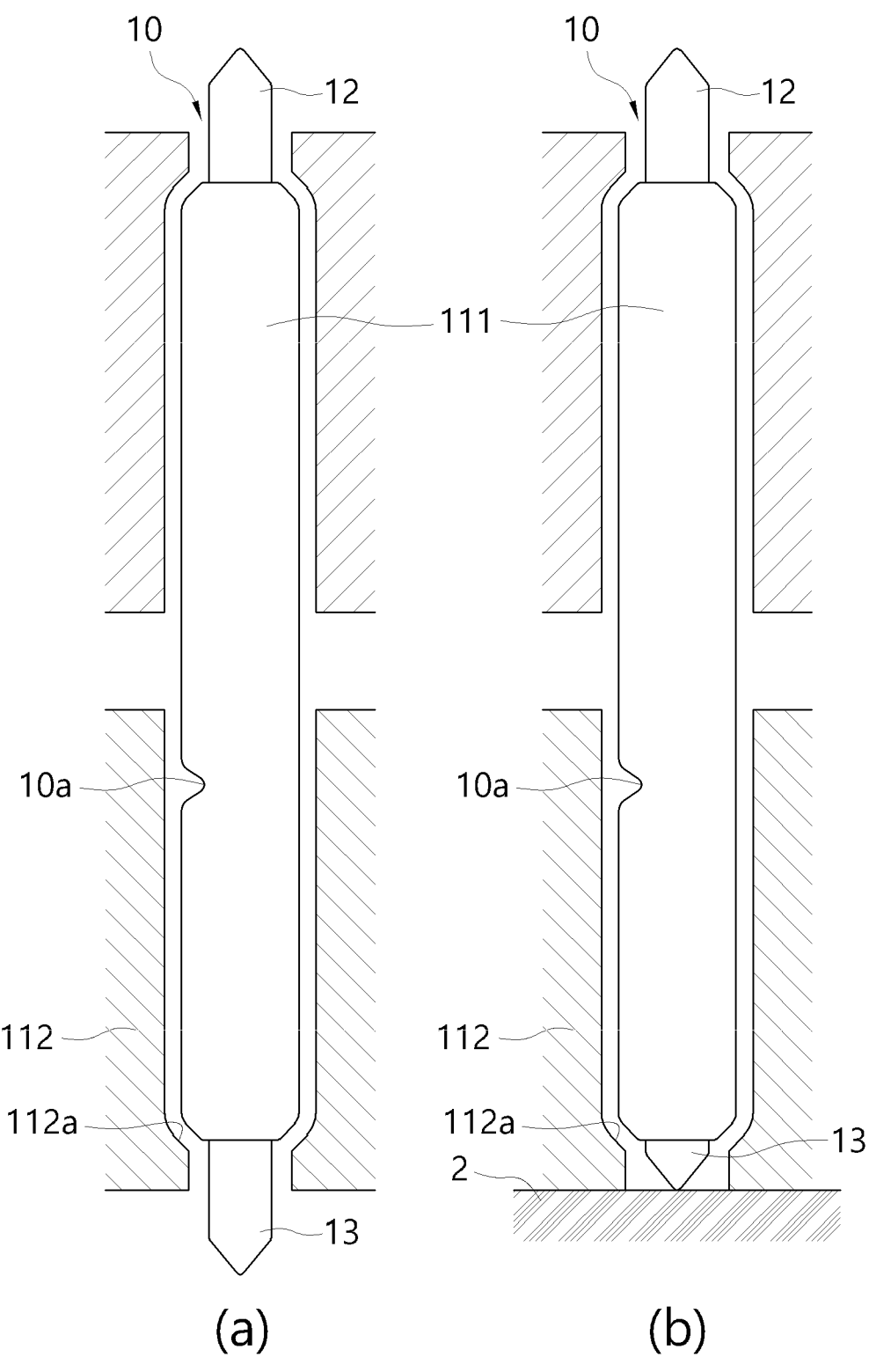
FIG. 7 is a partial cross-sectional view of a pogo pin with adjustable elastic force according to a fifth embodiment of the present invention.

Meanwhile, referring to FIG. 7, a partial cross-sectional view of a pogo pin 10 with adjustable elastic force according to a fifth embodiment of the present invention is shown. Here, it may further include a pin fixing member 112 for fixing the housing 111 of the pogo pin 10, and the pin fixing member 112 may be formed with a stepped jaw portion 112*a* that engages the upper and lower ends of the housing 111. In addition, in the case of (a), the upper and lower plunger pins 12 and 13 may be pressed as the pin fixing member 112 and a measurement object move. In the case of (b), as a general case, plunger pins 12 and 13 may be installed at the upper and lower parts of the pogo pins 12 and 13, respectively, and one pin of the upper and lower plunger pins 12 and 13 may be installed in a state that is always pressed against a measurement object 2. Of course, even in this case, by forming a local fixing part 10*a* in the housing 111 of the pogo pin 10, the elastic force of the plunger pins 12 and 13 with respect to measurement objects in close contact with the upper and lower parts can be set and adjusted.

Although exemplary embodiments of the present invention have been described, the idea of the present invention is not limited to the embodiments set forth herein. Those of ordinary skill in the art who understand the idea of the present invention may easily propose other embodiments through supplement, change, removal, addition, etc. of elements within the same idea, but the embodiments will be also within the idea scope of the present invention.

| <Description of Symbols> | |
|---|---|
| 1: semiconductor package | |
| 2: substrate | 10: pogo pin |
| 10a, 10b, 10c, 10d: local fixing part | |
| 11: housing | 12, 13: plunger pin |
| 20, 120: spring | 120a, 120b, 120c: invalid winding |

What is claimed is:

1. A pogo pin with adjustable elastic force, comprising:
a housing;
an upper plunger pin mounted on an upper portion of the housing to directly contact a measurement object;
a lower plunger pin mounted on a lower portion of the housing; and
a spring installed inside the housing to provide elastic force so that the upper and lower plunger pins contact the measurement object,
wherein a local fixing part protruding inward is formed on one side of the housing so that a first position of the spring can be pressed and fixed,
wherein the spring includes an upper spring disposed between the local fixing part and the upper plunger pin, and a lower spring disposed between the local fixing part and the lower plunger pin,
wherein a length from the local fixing part to the upper plunger pin is longer than a length from the local fixing part to the lower plunger pin,
wherein a number of turns of the upper spring is greater than a number of turns of the lower spring, and
wherein elastic force that the upper spring provides to the upper plunger pin is greater than elastic force that the lower spring provides to the lower plunger pin.

2. The pogo pin with adjustable elastic force of claim 1, wherein the local fixing part is formed in the form of at least one point at a first position of the housing.

3. The pogo pin with adjustable elastic force of claim 2, further comprising a plurality of the local fixing parts that are formed at the same height in a direction perpendicular to the longitudinal direction of the housing.

4. The pogo pin with adjustable elastic force of claim 1, wherein at least one local fixing part is formed in the shape of a line with the first position being in a direction perpendicular or parallel to the longitudinal direction.

5. The pogo pin with adjustable elastic force of claim 1, wherein the local fixing part is formed over the entire circumference of the housing, with the first position being in a direction perpendicular to the longitudinal direction.

6. The pogo pin with adjustable elastic force of claim 1, wherein the spring has one or more invalid windings that do not provide elastic force, and a local fixing part is formed in one or more selected from the invalid windings.

7. The pogo pin with adjustable elastic force of claim 1, wherein by forming the local fixing part, the elastic force of the plunger pins with respect to measurement objects in close contact with an upper and lower parts is set and adjusted.

8. The pogo pin with adjustable elastic force of claim 1, wherein a stepped jaw portion is formed in the housing of the pogo pin, and the stepped jaw portion is fixed to a pin fixing member for fixing the pogo pin.

9. The pogo pin with adjustable elastic force of claim 1, wherein the upper or lower portion of the housing is fixed to a jaw portion of a pin fixing member.

10. The pogo pin with adjustable elastic force of claim 1, wherein one of the upper or lower pin is installed in a state that is always pressed against the measurement object.

* * * * *